(12) United States Patent
Rivers

(10) Patent No.: US 6,201,729 B1
(45) Date of Patent: Mar. 13, 2001

(54) DRAM HIDDEN ROW ACCESS METHOD AND APPARATUS

(75) Inventor: James P. Rivers, Saratoga, CA (US)

(73) Assignee: Cisco Technology Inc., San Jose, CA (US)

( * ) Notice: Subject to any disclaimer, the term of this patent is extended or adjusted under 35 U.S.C. 154(b) by 0 days.

(21) Appl. No.: 09/241,819

(22) Filed: Feb. 1, 1999

(51) Int. Cl.[7] .................................................. G11C 11/24
(52) U.S. Cl. ............................................ 365/149; 365/207
(58) Field of Search ................................. 365/149, 207, 365/208, 189.05, 189.04

(56) References Cited

U.S. PATENT DOCUMENTS

| | | | |
|---|---|---|---|
| 4,281,398 | 7/1981 | McKenny et al. | 365/200 |
| 4,831,594 | 5/1989 | Khosrovi et al. | 365/222 |
| 4,893,278 | * 1/1990 | Ito | 365/203 |
| 5,265,236 | 11/1993 | Mehring et al. | 395/425 |
| 5,291,443 | 3/1994 | Lim | 365/189.04 |
| 5,406,526 | 4/1995 | Sugibayashi et al. | 365/230.03 |
| 5,619,473 | 4/1997 | Hotta | 365/238.5 |
| 5,650,972 | 7/1997 | Tomishima et al. | 365/207 |
| 5,787,255 | 7/1998 | Parlan et al. | 395/200.63 |
| 5,802,002 | * 9/1998 | Ienaga | 365/207 |
| 6,002,623 | * 12/1999 | Stave | 365/201 |

* cited by examiner

*Primary Examiner*—A. Zarabian
(74) *Attorney, Agent, or Firm*—Sheridan Ross P.C.

(57) ABSTRACT

A DRAM subsystem is provided in which multiple sets of sense amps are provided, such as two or more sense amps for each DRAM column. Processes inter-leave their row and column accesses such that one process uses a first set of sense amps for accessing latched data within a page, via column access, while another process uses a second set of sense amplifiers for a row access. This permits hiding the row access behind column accesses to increase the overall bandwidth of the DRAM subsystem. In one configuration write accesses involve performing a row access after column access is complete. In one configuration, the sense amps contain a mechanism that indicates they have been written e.g., so that sense amplifier latches associated with data that was not written will take on data read from the row.

19 Claims, 5 Drawing Sheets

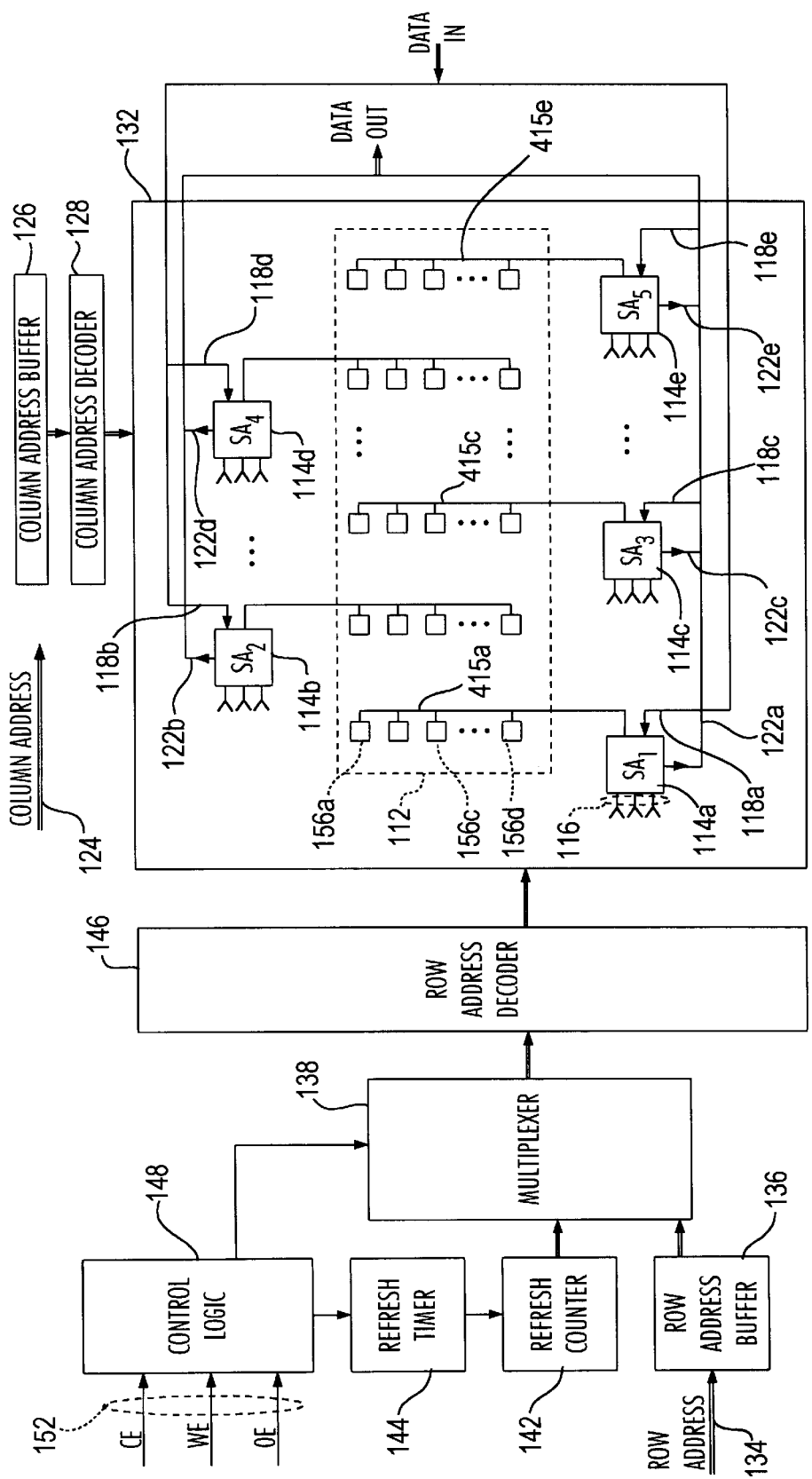
FIG. 1 - Prior Art

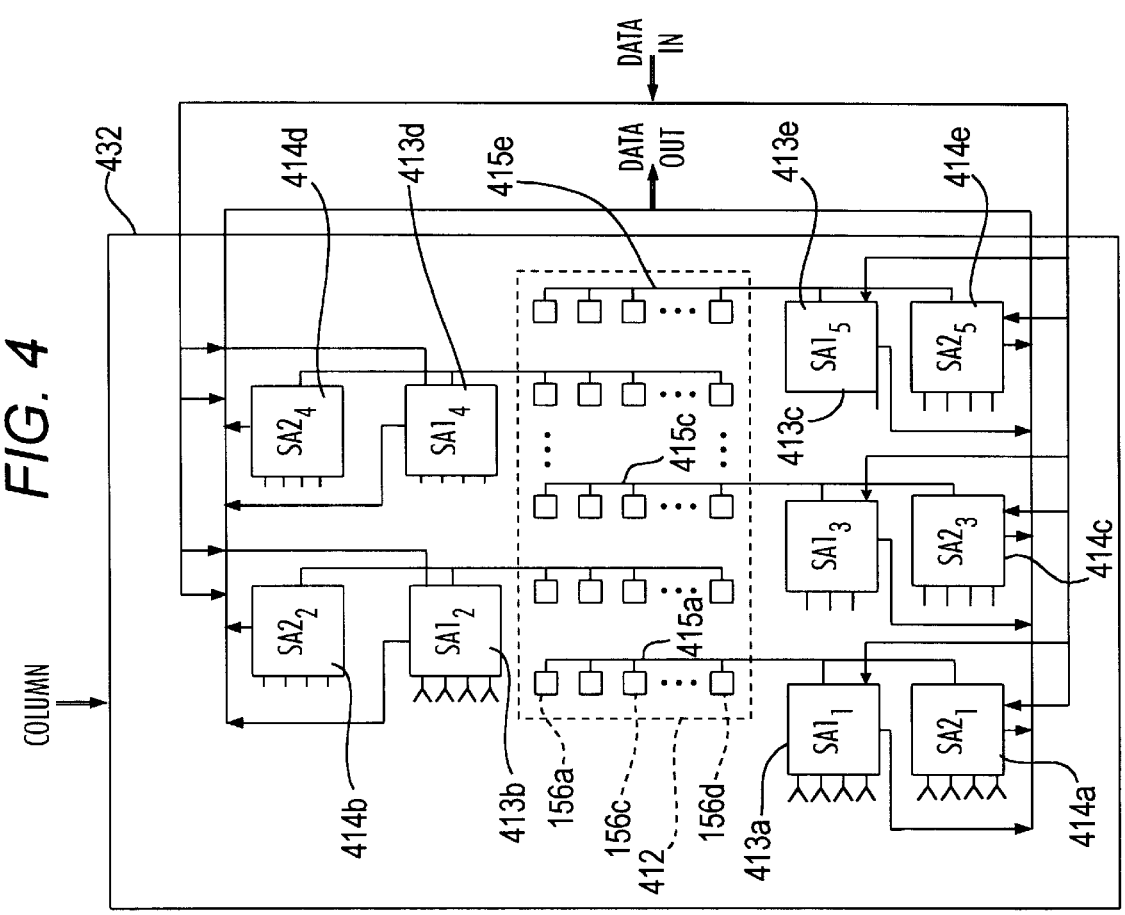
FIG. 4
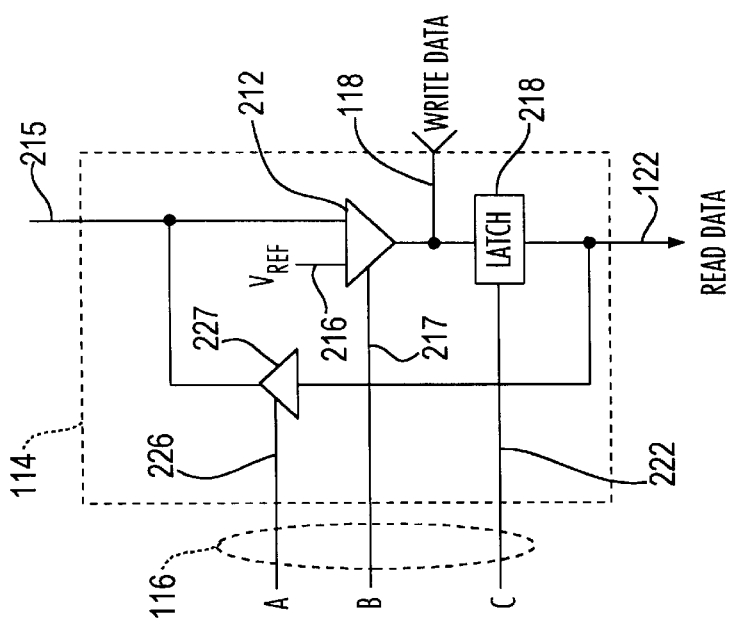
FIG. 2 - Prior Art

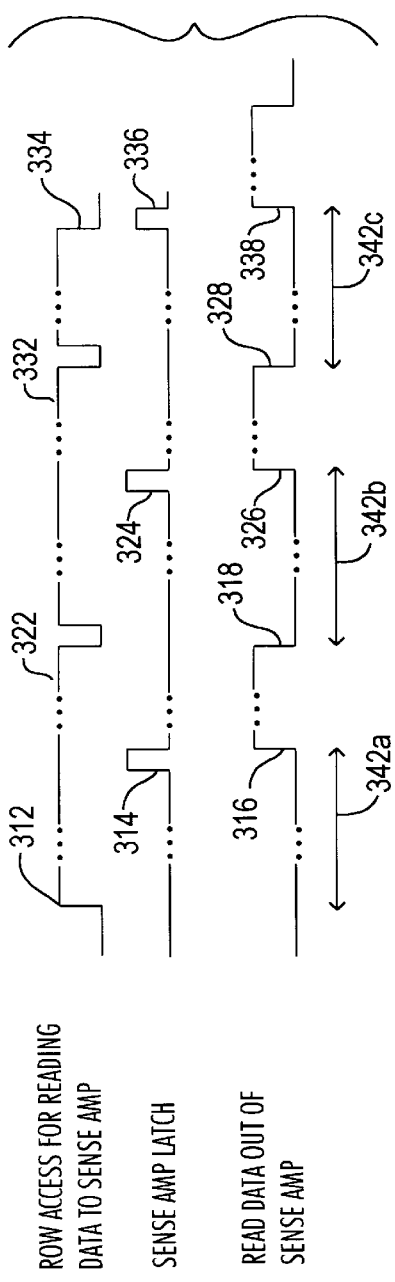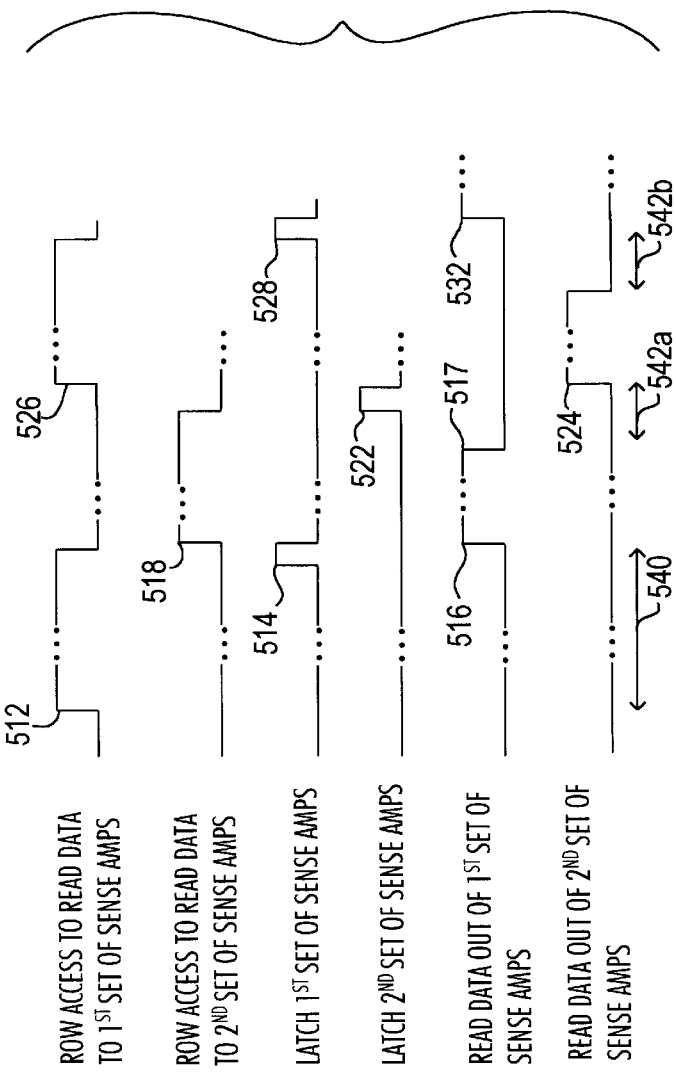

DRAM HIDDEN ROW ACCESS METHOD AND APPARATUS

The present invention relates to a hidden row access device and procedure for improving DRAM performance and in particular to a method and apparatus providing multiple sense amps per column.

BACKGROUND INFORMATION

The relatively low cost of dynamic random access memory (DRAM), as compared to other types of memory such as static random access memory (SRAM) and the like have made it the memory technology of choice for numerous applications including main memory for personal computers, work stations and similar devices, as well as numerous telecommunications devices including network routers, switches, bridges, gateways and the like. The performance of DRAM (e.g., as measured by the amount of time required, on average, for a word or other unit of data to be read from or written to the memory) is typically less favorable than performance available from other memory technologies. One of the factors contributing to the relatively lower performance of DRAM is row access delay. In a typical DRAM, there is a significant delay between the time row access procedures are initiated and the time the first data from the row becomes available for reading-out from the memory. Typically, row accesses include operations such as precharging all columns, addressing a row (or "page"), latching all columns into sense amplifiers and re-driving the columns with the output of the sense amplifiers. Accordingly, it would be advantageous to provide a system in which the effects of row access delays could be reduced so as to improve overall or average DRAM performance.

Many memories are configured to provide relatively rapid access to desired memory locations even when sequentially requested locations are relatively randomly distributed throughout memory. However, there are numerous applications in which many requests are for "bursts" of adjacent column locations within a row (even though the burst may be substantially less than an entire row). One example is when memory is used for storing numerous so-called frames of data in connection with a network switch or router. The design of many memory systems, by focusing on preserving relatively rapid access for randomly-positioned requests, have failed to achieve the type of performance that may be possible when applications typically request memory in bursts. Accordingly, it would be useful to provide a system which exploits the potential presented by particular applications in terms of the typical distribution of memory requests, such as applications in which memory requests are predominantly memory burst requests.

Some memory systems have achieved a degree of performance improvement by organizing the memory in, e.g., two memory banks. In such systems, some performance improvement is achieved by performing certain sequential operations on alternate banks. While it is often feasible to alternate a series of write operations between two banks, it may be infeasible to consistently alternate read operations between two banks. Accordingly, it would be useful to provide a memory system in which performance improvement is substantially consistently available for read operations, write operations or mixtures of the two types of operations.

SUMMARY OF THE INVENTION

The present invention provides for reducing or eliminating the disadvantageous aspects of DRAM row access delays to improve DRAM average performance. In one configuration, each column of a DRAM array is provided with two sense amplifiers ("sense amps"). In this way, after data is latched into a first set of sense amps (e.g. in response to a first read request) such data may be output from the first set of sense amps at substantially the same time that a row access is occurring to latch data into a second set of sense amps (e.g. in response to a second read request). In this way, for a series of reads, at any one time, data is being read into one of the set of sense amps and data is being read out from the other set of sense amps. The sets of sense amps exchange roles with each data request. In this way, the period consumed by a row access (preparing to read data from a row into a first set of sense amps) is not wasted or unproductive time since, during that time, data is being read out from the memory from the second set of sense amps (which hold data obtained in a previous row access cycle). Thus, by providing multiple senses amps for each column, it is possible to hide the row access behind column accesses to increase the overall bandwidth of the DRAM subsystem.

In some configurations of the present invention, the multiple sets of sense amps are also used when performing write operations (or mixed read and write operations). Preferably, a write operation involves performing all pertinent column accesses before a row access occurs.

BRIEF DESCRIPTION OF THE DRAWINGS

FIG. 1 is a block diagram of a memory system according to previous devices;

FIG. 2 is a block diagram of a sense amp according to previous devices;

FIG. 3 is a timing diagram depicting a series of read operations according to previous devices;

FIG. 4 is a block diagram illustrating a portion of the memory system according to an embodiment of the present invention;

FIG. 5 is a timing diagram illustrating a series of read operations according to an embodiment of the present invention;

DETAILED DESCRIPTION

Figure 6:
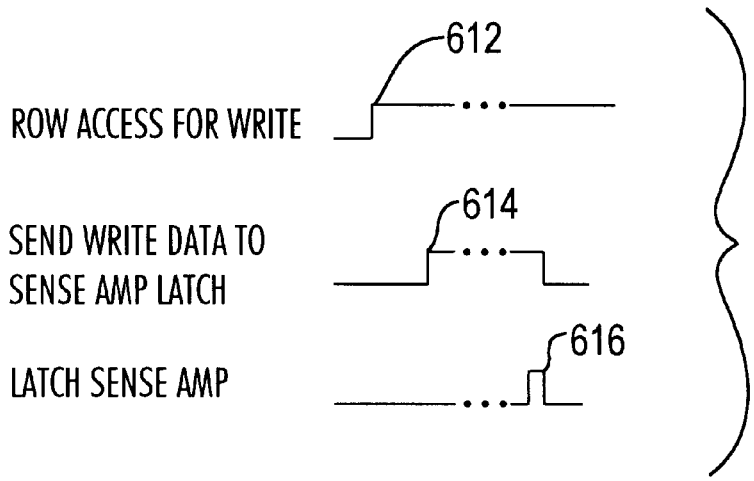
FIG. 6 is a timing diagram illustrating a write operation according to previous devices.

Before describing features of the present invention, certain aspects of memory system according to previous devices will be described. As depicted in FIG. 1, in a typical DRAM memory system, an array of memory cells 112 is arranged in columns, with each column being coupled to a single sense amp 114a through 114e. Each sense amp receives a plurality of control signals 116 and can both receive write data on write data lines 118a through 118e and output read data on output data lines 122a through e. Although, for clarity, FIG. 1 depicts separate data input lines and data output lines, some configurations provide a single set of data lines for both input and output. A column address 124 sent to a column address buffer 126 is decoded by a column address decoder 128 before being applied to the DRAM 132. A row address 134 is provided to a row address buffer 136. A multiplexer 138 provides, to the row address decoder 146, either the row address or a refresh row from a refresh counter 142, which increments in response to a refresh timer 144. Control logic 148 receives control signals 152 such as chip enable (CE), write enable (WE), output enable (OE), row address strobe (RAS), column address strobe (CAS) and the like for controlling the memory. The illustration of FIG. 1 is one of numerous types of memory systems whose configuration, fabrication and use are well known to those of skill in the art.

FIG. 2 is a block diagram of a sense amp, simplified to assist in the present description (e.g. a real embodiment would typically have a device or group of devices that implement multiple blocks). As depicted in FIG. 2, a sense amp 114 includes a data detector 212 which can detect the state of data on a column line 215 with respect to a reference voltage 216, when enabled by control signal "B" 217. The output of the data detector 212 is provided to a latch 218 for latching in response to a latch signal "C" 222. The output of the latch both provides the read data output 122 and drives back onto the column line 215 via amplifier 227, under control of control signal "A" 226.

Table I shows the state of the control signals A, B, C during read and write operations.

TABLE I

|   | Read   | Write  |
|---|--------|--------|
| A | Strobe | 1      |
| B | 1      | 0      |
| C | Strobe | Strobe |

FIG. 3 depicts the timing of a series of three read operations according to certain previous devices. In FIG. 3, it is assumed control signals are active high. For purposes of illustration, the series of read operations will be described for a read in the first row 156a followed by a read in the last row 156d followed by a read in the third row 156c. A row access of the first row 156a is initiated 312. The sense amp latch control 222 is strobed 314 to latch the data in each column of the first row 156a into the respective sense amps for those columns 114a through 14e. Thereafter, the data residing in the sense amps are strobed out from the latch 218 of the sense amps onto the read data lines 122 to read the data out of the sense amps 316. After the data is read-out of the sense amps 318, a new row access procedure can be initiated 322 for the next read request (in this example, a request for reading data in the last row 156d). At the end of the row access procedures for the last row 156d, the data is latched 324 into the respective sense amps for each column and, at this point, data latched in the sense amps can be read-out 326. When the readout of data from row 156d is completed 328, a new row access procedure can be initiated 332 for the next read access (in this example, an access in the third row 156c). After row access procedures for the third row 156c are completed 334 and the data is latched 336 into the respective sense amps, read-out of data from the sense amps is initiated 338.

As can be seen from FIG. 3, in the described procedure there are substantial periods 342a, b, c during which data is not being output from the memory (and which are employed for row access procedures).

In the embodiment of FIG. 4, improvements in performance of a DRAM 432 is facilitated by providing each column line 415a through e of the memory array with two sense amps coupled to the column line. For example, the column line 415a is coupled to a first sense amp 413a and a second sense amp 414a. Column line 415b is coupled to a first sense amp 413b and a second sense amp 414b. In this fashion, for a DRAM 432 having N column lines, there will be a first set of N sense amps (represented, in FIG. 4, by sense amps 413a through 413e) coupled, respectively, to the N column lines and a second set of N sense amps (represented, in FIG. 4, by sense amps 414a through 414e) coupled, respectively, to the N column lines. Each of the sense amps is provided with control signals and with output lines (for reading out data from the sense amps) and input lines (for reading data into the sense amps). In some embodiments it is preferred to provide sense amps 413a through 413e, 414a through 414e which are configured differently from those depicted in FIG. 2, particularly, when it is desired to use features of the present invention in connection with writing, as well as reading, data. However, at least some features of the present invention can be provided using sense amps similar to those depicted in FIG. 2, especially in connection with read operations, and for purposes of illustration, the description below and in connection with FIGS. 4 and 5 will include a discussion with reference to the sense amp depicted in FIG. 2.

FIG. 5 provides an illustration of a procedure for reading data out of the device of FIG. 4 in response to a series of read requests. FIG. 5 will be described in connection with a series of three read requests for data in the first row 156a, last row 156d and third row 156c of the memory array 412. A row access procedure with respect to the first row 156a is initiated 512. The data discriminator control 217 is set active for the first set of sense amps 413a and preferably set inactive for the second set of sense amps 414a through 414e such that, when the data latch is strobed 514, data in the first row 156a is latched into sense amps in the first set of sense amps 413a through 413e and preferably is not latched into the second set of sense amps 414a through 414e. At this point, data may be read-out 516 from the first set of sense amps 413a through 413e. As shown in FIG. 5, it is not necessary to wait for completion 517 of read-out of data from the data request before initiating the next row access procedure. As shown in FIG. 5, while the read-out of data from the first set of sense amps 413a through 413e is proceeding 516, row access procedures are initiated 518 for the next row 156d. For clarity, in FIG. 5, row accesses which provide data to the first set of sense amps 413a through 413e are shown separately from row accesses which provide data to the second set of sense amps 414a through 414e. During row access procedures for row 156d, the data discriminator control 217 is set active for the second set of sense amps 414a through 414e and inactive for the first set of sense amps 413a through 413e such that data from the last row 156d is provided to the latches of the second set of sense amps 414a through 414e but not to the latches of the first set of sense amps 413a through 413e. Accordingly, when the data latch control 222 for the second set of sense amps is strobed 522, the second set of sense amps will hold data from the last row 156d and data may then be read-out 524 from the second set of sense amps. During the time that data is being read-out from the second set of sense amps 524, row access procedures can be initiated 526 for the next read request (in this example, a request for data in the third row 156c). During the row access procedures 526 for the third row 156c, the data discriminator control signal 217 for the first set of sense amps 413a through 413e is set active and data discriminator control signals 217 for the second set of sense amps 414a through 414e is set inactive such that data from the third row 156c is placed in the latches of the first set of sense amps 413a through 413e but not the second set of sense amps 414a through 414e. After the latch control 222 for at least the first set of sense amps 413a through 413e is strobed 528, output of data from the first set of sense amps 413a through 413e can commence 532.

As can be seen from FIG. 5, in particular in comparison with FIG. 3, other than during the initial row access 540 the length of time during which data is not being output 542a, 542b is substantially reduced and might, in some configurations, be eliminated.

As depicted in FIG. 6, in previous DRAM devices, a write operation typically begins with performing a row access 612, with the row being held open while write data is sent to the sense amp 614 and latched-in 616. The latched data is used to drive the columns while the row remains open. New data overwrites the data contained in the sense amplifier latches 614 thus changing the addressed element in the open row.

Figure 7:
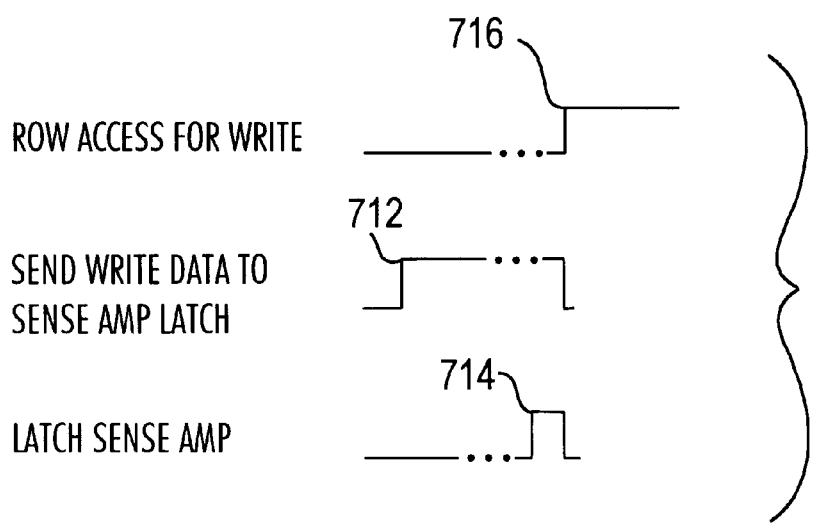
FIG. 7 is a timing diagram depicting a write operation according to an embodiment of the present invention.

FIG. 7 depicts a write access according to an embodiment of the present invention. Because of the presence of two or more sets of sense amps and the preferred use of interleaving memory accesses using the two sets of sense amps, it is possible that the system may be performing a row access for a read (using one set of sense amps) during the time that a write is being performed (using the other set of sense amps). According to one embodiment of the present invention, unlike the read procedure of FIG. 3 (when a pre-row access is performed 312, 316) and unlike the pre-row access for writing of the previous procedures (as depicted in FIG. 6), the procedure depicted in FIG. 7 involves performing a post-row access. New data, intended to be written into the memory, is sent to the sense amps 712 and latched 714 before beginning the row access 716. That is, a row access associated with the write operation will occur after the column access is complete.

Figure 8A:
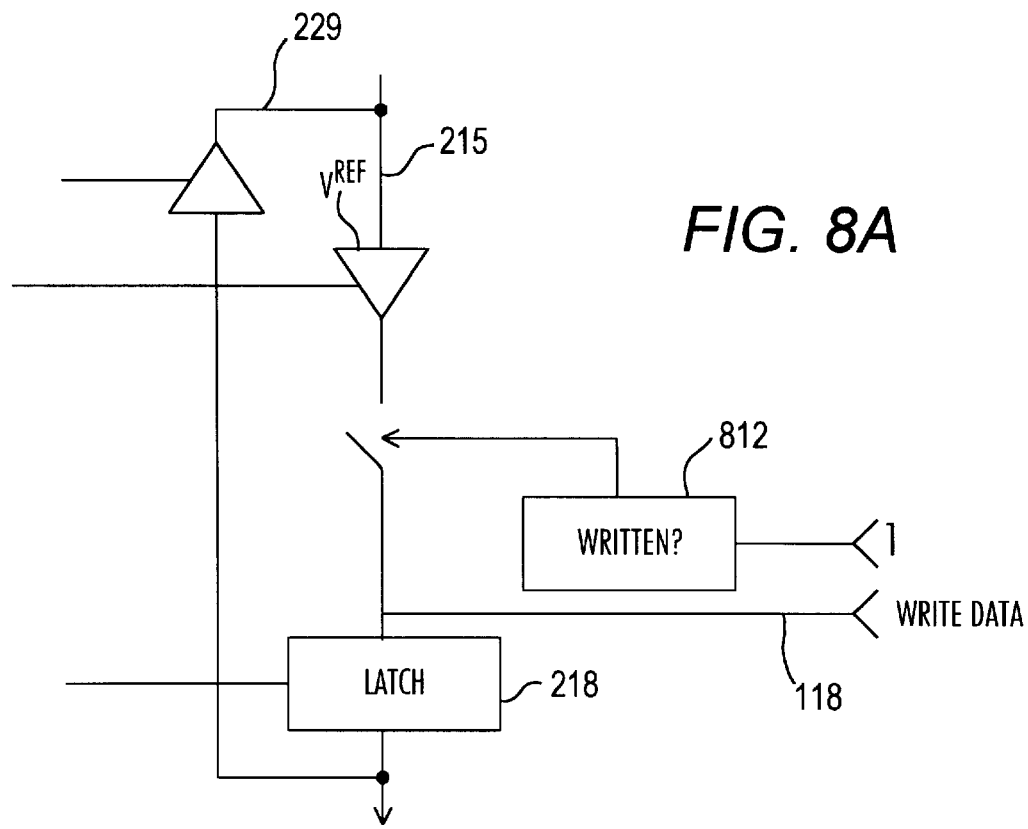
FIGS. 8A and 8B are block diagrams depicting a sense amp according to an embodiment of the present invention in first and second configurations.
Figure 8B:
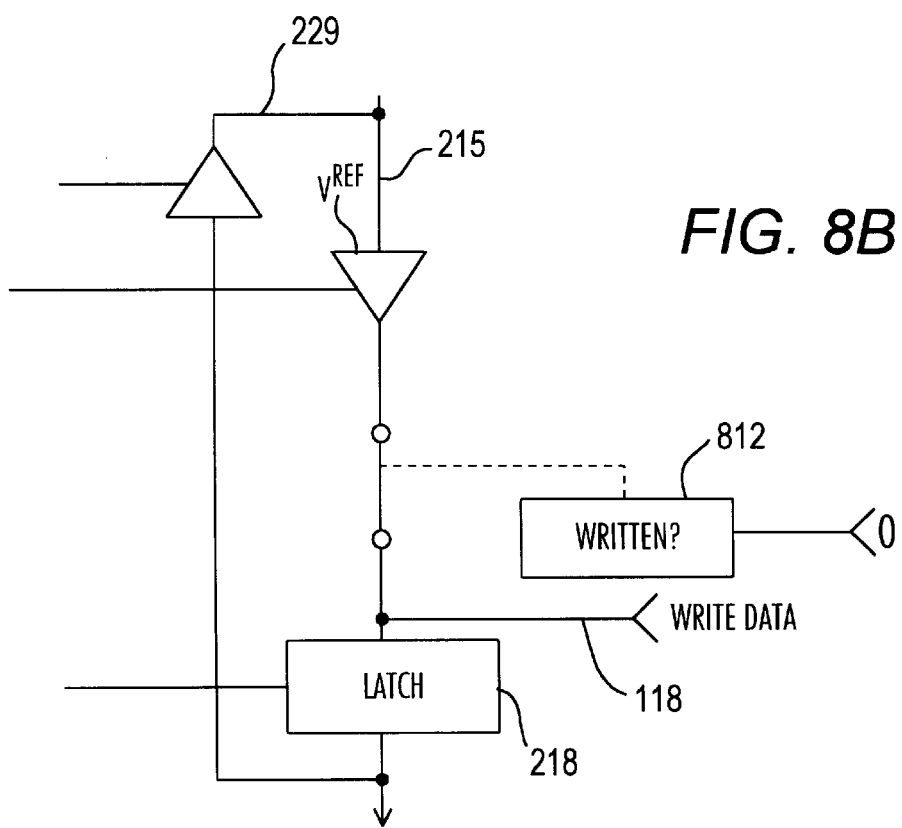

Preferably, as depicted in FIGS. 8A and 8B, the sense amp contains a mechanism (such as a flag bit 812 which may be stored in a register) which indicates that new "write" data has been sent to the latch. Although, for illustration purposes, a mechanical switch is shown in FIGS. 8A and 8B, it is contemplated that, in practice, an electronic switch would be used in a manner that will be understood by those of skill in the art. Among the various sense amps, those sense amplifier latches which are associated with columns that were not written (as indicated, e.g. by a zero in the flag bit FIG. 8B) would take on the data from the row (page) i.e., off of the column line 215. Sense amplifier latches associated with data that was written (as indicated, e.g. by a one in the flag bit, FIG. 8A) would retain the written value i.e., the value provided over the write data line 118, thus overwriting any data read from the row. After all pertinent column accesses have occurred, the row access would occur 716 thus writing the data output from the latch 218, via line 229, back to the coupled column in the open row.

By using multiple sets of sense amps, it is possible to multiplex row accesses among multiple reads, multiple writes or mixed read and write operations. Preferably, the operations are scheduled, such as by using advanced information about the sequence of accesses, so that the multiplex row accesses can be performed substantially continuously, even when accesses are mixed read/write operations. When used in a system where advanced information about the sequence of accesses exists (such as a packet buffer in a networking device), the sets of sense amplifiers can be simultaneously used by two processes. Each process can have its own set of sense amplifiers, with the processes interleaving their row and column accesses such that one process accesses latched data within the page (column access), while the other process uses its set of sense amplifiers for a row access.

In light of the above information, a number of advantages of the present invention can be seen. The invention uses two or more sets of sense amplifiers to hide row access behind column access to increase the overall bandwidth of a DRAM subsystem. The invention permits systems that have DRAM subsystem performances which rival the performance of SRAM but retain the cost competitiveness of DRAM. The pipelined, look-ahead interfaces are especially beneficial in systems where data is accessed in bursts e.g., that require a multiple column accesses but which do not exceed a page.

A number of variations and modifications of the invention can be used. It is possible to use some aspects of the invention without using others, such as providing for hiding of row accesses during read operations without hiding row accesses for write operations. Although embodiments of the present invention have been described which provide two sense amps for each DRAM column, it is possible to configure other embodiments in which three or more sense amps per column are provided (e.g., if sense amp readout periods are less than about half a row access period) and/or to provide different numbers of sense amps per column in different banks (or other portions) of memory.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and\or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus for use in a dynamic random access memory system, comprising:
   an array of memory cells arranged in a plurality of addressable rows and columns, each column of memory cells coupled by a column line; and
   at least two sense amplifiers coupled to each column line including first and second sense amplifiers coupled to a first column line, and third and fourth sense amplifiers, distinct from said first and second sense amplifiers, coupled to a second column line, each sense amplifier receiving an unamplifier signal from a corresponding column line;

wherein stored data output from said memory system includes at least a first bit output by said first sense amplifier in the absence of said bit being received in said second sense amplifier from said first sense amplifier and output from said second sense amplifier.

2. Apparatus, as claimed in claim 1, further comprising at least a first bit register for storing an indication of whether at least a first one of said sense amplifiers has write data stored therein.

3. Apparatus, as claimed in claim 2, further comprising a switch, responsive to said indication which provides data from said column line to at least said first sense amplifier only when write data is not stored therein.

4. A method for use in a dynamic random access, said dynamic access memory (DRAM) having an array of memory cells arranged in a plurality of addressable rows and columns, the columns of said memory cells coupled by column lines, the method comprising:
   providing a first set of sense amplifiers coupled to said column lines;
   providing a second set of sense amplifiers, distinct from said first set of sense amplifiers, coupled to said column lines;
   said first and second sets including first and second sense amplifiers coupled to a first column line, and third and fourth sense amplifiers, distinct from said first and second sense amplifiers, coupled to a second column line, each sense amplifier receiving an unamplifier signal from a corresponding column line;
   initiating a row access procedure for a first row of said dynamic random access memory;
   latching at least some data from said first row into at least some of said first set of sense amplifiers;
   initiating a row access procedure for a second row of said dynamic random access memory distinct from said first row;
   latching at least some data from said second row into at least some of said second set of sense amplifiers;
   reading first data out of said first set of sense amplifiers during a first data read-out period;
   wherein said step of initiating a row access procedure for said second row occurs substantially simultaneously with at least a portion of said first data read-out period in the absence of a need to provide said first data to said second set of sense amplifiers, doing said first data read-out period.

5. A method, as claimed in claim 4 wherein, during a series of normal DRAM read operations, data is latched into said first set of sense amplifiers substantially simultaneously with reading-out of data from said second set of sense amplifiers.

6. A method, as claimed in claim 5 wherein data is latched into said second set of sense amplifiers substantially simultaneously with reading-out of data from said first set of sense amplifiers.

7. A method, as claimed in claim 4, further comprising:
   coupling at least one of said first set of sense amplifiers and at least one of said second set of sense amplifiers to each of said column lines.

8. A method, as claimed in claim 7, further comprising:
   sending write data to at least some of said first set of sense amplifiers; and
   initiating row access procedures for at least a first row of said DRAM after said step of sending write data.

9. A method for use in a dynamic random access, said dynamic access memory (DRAM) having an array of memory cells arranged in a plurality of addressable rows and columns, the columns of said memory cells coupled by column lines, the method comprising:
   providing a first set of sense amplifiers coupled to said column lines;
   providing a second set of sense amplifiers, distinct from said first set of sense amplifiers, coupled to said column lines
   said first and second sets including first and second sense amplifiers coupled to a first column line, and third and fourth sense amplifiers, distinct from said first and second sense amplifiers, coupled to a second column line, each sense amplifier receiving an unamplifier signal from a corresponding column line;
   initiating a row access procedure for a first row of said dynamic random access memory;
   latching at least some data from said first row into at least some of said first set of sense amplifiers without the need to use said second set of sense amplifiers;
   initiating a row access procedure for a second row of said dynamic random access memory;
   latching at least some data from said second row into at least some of said second set of sense amplifiers without the need to use said first set of sense amplifiers;
   reading data out of said first set of sense amplifiers during a first data read-out period;
   wherein said step of initiating a row access procedure for said second row occurs substantially simultaneously with at least a portion of said first data read-out period;
   initiating a row access procedure for a third row into at least some of said first set of sense amplifiers;
   latching at least some data from said third row into at least some of said first set of sense amplifiers without the need to use said second set of sense amplifiers;
   reading data out of said second set of sense amplifiers during a second data read-out period;
   wherein said step of initiating a row access procedure for a third row occurs substantially simultaneously with at least a portion of said second data read-out period.

10. Apparatus for use in a dynamic random access memory system, comprising:
    an array of memory cells arranged in a plurality of addressable rows and columns, each column of memory cells coupled by a column line; and
    at least two data sensing means coupled to each column line;
    wherein stored data output from said memory system includes at least a first bit output by said first data sensing means in the absence of said bit being received in said second data sensing means from said first data sensing means and output from said second data sensing means.

11. Apparatus as claimed in claim 10 wherein said data sending means are sense amplifiers.

12. Apparatus, as claimed in claim 11, further comprising means for storing an indication of whether at least a first one of said sense amplifiers has write data stored therein.

13. Apparatus, as claimed in claim 12, further comprising means for providing data from said column line to at least said first sense amplifier only when write data is not stored therein.

14. Apparatus for use in a dynamic random access, said dynamic access memory (DRAM) having an array of memory cells arranged in a plurality of addressable rows and columns, the columns of said memory cells coupled by column lines, comprising:

a first set of sense amplifier means coupled to said column lines;

a second set of sense amplifier means, distinct from said first set of sense amplifier means, coupled to said column lines;

wherein stored data output from said memory system includes at least a first bit output by said first sense amplifier means in the absence of said bit being received in said second sense amplifier means from said first sense amplifier means and output from said second sense amplifier means.

15. Apparatus, as claimed in claim 14 further comprising:

means for initiating a row access procedure for a first row of said dynamic random access memory;

first means for latching at least some data from said first row into at least some of said first set of sense amplifier means;

means for initiating a row access procedure for a second row of said dynamic random access memory, second means for latching at least some data from said second row into at least some of said second set of sense amplifier means without the need to use said first means;

means for reading data out of said first set of sense amplifier means during a first data read-out period;

wherein said means for initiating a row access procedure for said second row initiates said row access procedure for said second row substantially simultaneously with at least a portion of said first data read-out period.

16. Apparatus, as claimed in claim 15 wherein said first means for latching data into said first set of sense amplifiers latches said data into said first set of sense amplifier means substantially simultaneously with reading-out of data from said second set of sense amplifier means.

17. Apparatus, as claimed in claim 16 wherein said second means for latching data into said second set of sense amplifier means latches said data into said second set of sense amplifier means substantially simultaneously with reading-out of data from said first set of sense amplifier means.

18. Apparatus, as claimed in claim 14, wherein at least one of said first set of sense amplifier means and at least one of said second set of sense amplifier means is coupled to each of said column lines.

19. Apparatus, as claimed in claim 18, further comprising:

means for sending write data to at least some of said first set of sense amplifier means; and means for initiating row access procedures for at least a first row of said DRAM after said means for sending sends at least some of said write data to at least some of said first set of sense amplifier means.

* * * * *